(12) United States Patent
Baek et al.

(10) Patent No.: US 7,541,225 B2
(45) Date of Patent: Jun. 2, 2009

(54) METHOD OF MANUFACTURING A THIN FILM TRANSISTOR ARRAY PANEL THAT INCLUDES USING CHEMICAL MECHANICAL POLISHING OF A CONDUCTIVE FILM TO FORM A PIXEL ELECTRODE CONNECTED TO A DRAIN ELECTRODE

(75) Inventors: Bum-Ki Baek, Gyeonggi-do (KR); Hyuk-Jin Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 414 days.

(21) Appl. No.: 11/332,076

(22) Filed: Jan. 13, 2006

(65) Prior Publication Data
US 2006/0194376 A1    Aug. 31, 2006

(30) Foreign Application Priority Data
Jan. 14, 2005    (KR) .................... 10-2005-0003680

(51) Int. Cl.
*H01L 21/84*    (2006.01)

(52) U.S. Cl. .................... 438/149; 438/158; 438/633; 257/E21.7

(58) Field of Classification Search ............... 257/E21.7
See application file for complete search history.

(56) References Cited

U.S. PATENT DOCUMENTS

| | | | |
|---|---|---|---|
| 5,780,326 A * | 7/1998 | Dennison et al. | 438/152 |
| 7,056,834 B2 * | 6/2006 | Mei et al. | 438/758 |
| 7,145,613 B2 * | 12/2006 | Zhang et al. | 349/44 |
| 2004/0229466 A1 * | 11/2004 | Ishikawa et al. | 438/689 |

* cited by examiner

*Primary Examiner*—Stephen W Smoot
(74) *Attorney, Agent, or Firm*—Haynes and Boone, LLP (57) ABSTRACT

A method of manufacturing a thin film transistor array panel is provided, the method including forming a thin film transistor having a gate electrode, a source electrode, and a drain electrode on a substrate, forming a passivation layer on the source electrode and the drain electrode, forming a photoresist film on the passivation layer, selectively etching the passivation layer using the photoresist film as a mask, forming a conductive film, and removing the photoresist film along with the conductive film disposed on the photoresist film using a CMP (chemical mechanical polishing) process to form a pixel electrode being connected to the drain electrode.

20 Claims, 13 Drawing Sheets

METHOD OF MANUFACTURING A THIN FILM TRANSISTOR ARRAY PANEL THAT INCLUDES USING CHEMICAL MECHANICAL POLISHING OF A CONDUCTIVE FILM TO FORM A PIXEL ELECTRODE CONNECTED TO A DRAIN ELECTRODE

RELATED APPLICATION

The present application claims priority from Korean Patent Application No. 2005-0003680 filed on Jan. 14, 2005, the disclosure of which is hereby incorporated herein by reference in its entirety.

BACKGROUND OF THE INVENTION (a) Field of the Invention

The present invention relates to a thin film transistor array panel and a manufacturing method thereof.

(b) Description of Related Art

An active type of display device such as a liquid crystal display (LCD) and an organic light emitting display (OLED) includes a plurality of pixels arranged in a matrix, field generating electrodes and switching elements. The switching elements include thin film transistors (TFTs) having three terminals, i.e., a gate, a source, and a drain. The TFT of each pixel selectively transmits data signals to the field-generating electrode in response to gate signals.

The display device further includes a plurality of signal lines for transmitting signals to the switching elements, which include gate lines transmitting gate signals and data lines transmitting data signals.

The LCD and the OLED include a panel provided with the TFTs, the field-generating electrodes, and the signal lines. This type of panel is referred to as a TFT array panel.

The TFT array panel has a layered structure that includes several conductive layers and insulating layers. The gate lines, the data lines, and the field-generating electrodes are formed of different conductive layers and are separated by insulating layers.

The TFT array panel having the layered structure is manufactured by several lithography steps and etching steps. Since lithography requires time and incurs costs, it is desirable to reduce the number of lithography steps.

SUMMARY OF THE INVENTION

A method of manufacturing a thin film transistor array panel is provided. The method includes forming a thin film transistor having a gate electrode, a source electrode, and a drain electrode on a substrate, forming a passivation layer on the source electrode and the drain electrode, forming a photoresist film on the passivation layer, selectively etching the passivation layer using the photoresist film as a mask, forming a conductive film, and removing the photoresist film and the conductive film disposed on the photoresist film using a CMP (chemical mechanical polishing) process to form a pixel electrode being connected to the drain electrode.

Another method of manufacturing a thin film transistor array panel is provided includes forming a gate line including a gate electrode on a substrate, forming a gate insulating layer on the gate line, forming a semiconductor layer on the gate insulating layer, forming an ohmic contact layer on the semiconductor layer, forming a data line and a drain electrode on the ohmic contact layer, forming a passivation layer on the data line and the drain electrode, forming a first photoresist film on the passivation layer, etching the passivation layer using the photoresist film as a mask, forming a conductive film, and removing the first photoresist film and the conductive film disposed on the first photoresist film using a CMP (chemical mechanical polishing) process to form a pixel electrode being connected to the drain electrode.

The first photoresist film may be formed by using a photo mask including a light blocking area, a translucent area, and a light transmitting area. The translucent area may be formed on an area enclosed by the gate line and the data line, including a portion of the drain electrode.

The etching of a passivation layer may include forming a first contact hole exposing an end portion of the data line, and may further include forming a second contact hole exposing an end portion of the gate line by etching the passivation layer with the gate insulating layer.

The formation of a pixel electrode may include forming first and second contact assistants connected to the end portion of the data line and the end portion of the gate line through the first and second contact holes, respectively.

The formation of the semiconductor layer and the formation of the data line and the drain electrode may include depositing the gate insulating layer, an intrinsic a-Si layer, an extrinsic a-Si layer, and a conductive layer in sequence, forming a second photoresist on the conductive layer such that the second photoresist has different thicknesses in accordance with positions on the conductive layer, and selectively etching the conductive layer, the extrinsic a-Si layer, and the intrinsic a-Si using the second photoresist film as a mask to form the data line, the drain electrode, and the ohmic contact layer.

The second photoresist film may be formed by using a photo mask including a light blocking area, a translucent area, and a light transmitting area.

The first photoresist may have a thickness of 1 to 4 microns.

In another aspect, the invention is a thin film transistor array panel that includes a thin film transistor, a passivation layer, a photoresist film, and a pixel electrode. The thin film transistor includes a gate electrode, a source electrode, and a drain electrode formed on a substrate. The passivation layer is formed on a first portion of the source electrode and the drain electrode, the photoresist film is formed on the passivation layer, and the pixel electrode formed on a second portion of the drain electrode.

The pixel electrode may be formed on a sidewall of the passivation layer and the photoresist film.

A surface height of the photoresist may be the same as that of a portion of the pixel electrode.

The thin film transistor array panel may further include a gate line formed on the substrate and including a gate electrode, a gate insulating layer formed on the gate line, a semiconductor layer formed on the gate insulating layer, and a data line formed on the semiconductor layer, including the source electrode, and separated from the drain electrode.

The second portion of the drain electrode may overlap an area enclosed by the gate line and the data line.

The photoresist film may include a first contact hole exposing a portion of the data line along with the passivation layer and a second contact hole exposing a portion of the gate line along the passivation layer and the gate insulating layer.

The thin film transistor array panel may further include first and second contact assistants connected to the gate line and the data line through the first and second contact holes, respectively.

A surface height of the photoresist film may be the same as surface heights of the first and second contact assistants.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

The present invention will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. It will be understood that when an element such as a layer, region, or substrate is referred to as being "on" another element, it can be directly on the other element or intervening elements may be present.

TFTs and manufacturing methods thereof according to embodiments of the present invention will now be described with reference to the accompanying drawings.

A TFT array panel according to an embodiment of the present invention will be described in detail with reference to FIGS. 1, 2A, and 2B.

Figure 1:
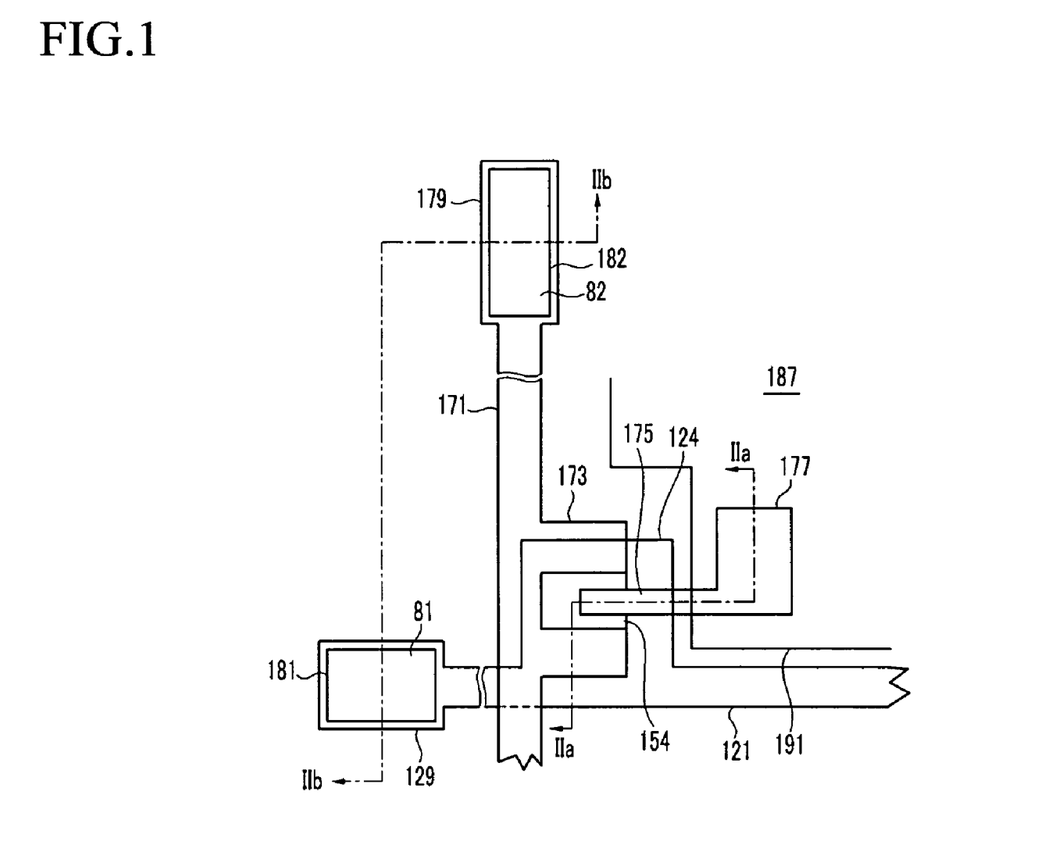
FIG. 1 is a layout view of a TFT array lower panel according to an embodiment of the present invention.
Figure 2A:
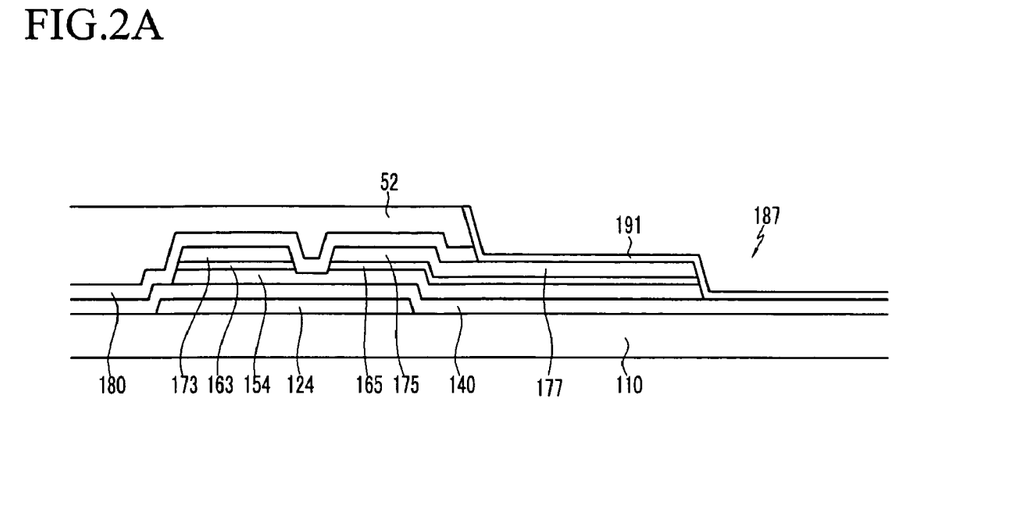
FIG. 2A is a sectional view of the TFT array panel shown in FIG. 1 taken along the line IIA-IIA.
Figure 2B:
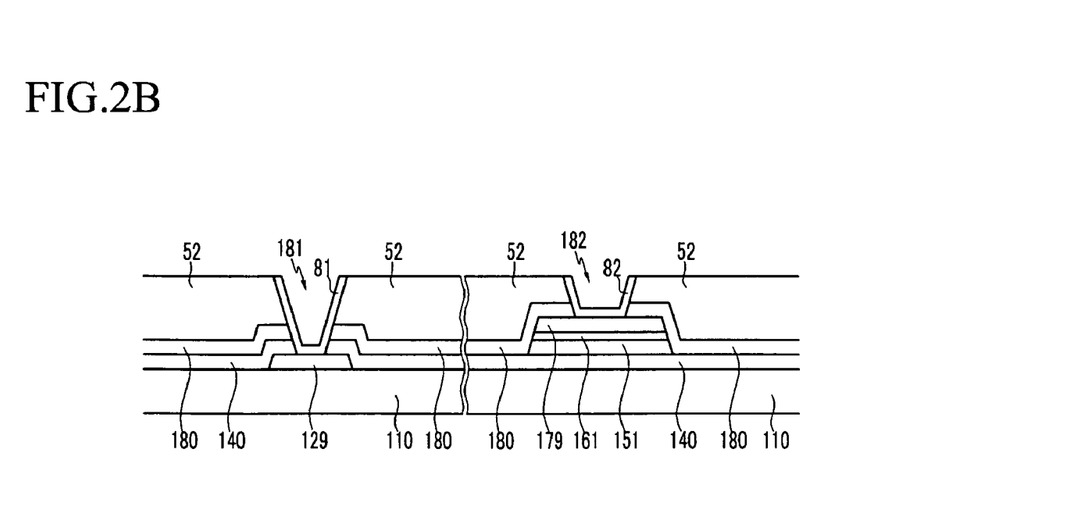
FIG. 2B is a sectional view of the TFT array panel shown in FIG. 1 taken along the line IIB-IIB.

FIG. 1 is a layout view of a TFT array lower panel according to an embodiment of the present invention, FIG. 2A is a sectional view of the TFT array panel shown in FIG. 1 taken along the line IIA-IIA, and FIG. 2B is a sectional view of the TFT array panel shown in FIG. 1 taken along the lines IIB-IIB.

A plurality of gate lines 121 are formed on an insulating substrate 110 by using a material such as transparent glass or plastic.

The gate lines 121 transmit gate signals and extend substantially in a first direction. Each of the gate lines 121 includes a plurality of gate electrodes 124 projecting upward as shown in FIG. 1 and having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. The gate lines 121 may extend to be connected to a driving circuit that may be integrated on the substrate 110.

The gate lines 121 are preferably made of an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, or Ti. However, they may have a multi-layered structure including two conductive films (not shown) having different physical characteristics. One of the two films is preferably made of a low-resistivity metal such as an Al-containing metal, a Ag-containing metal, and a Cu-containing metal for reducing signal delay or voltage drop. The other film is preferably made of a material such as a Mo-containing metal, Cr, Ta, or Ti, which have good physical chemical, and electrical contact characteristics with other materials such as indium tin oxide (ITO) and indium zinc oxide (IZO). For example, a lower Cr film may be combined with an upper Al (alloy) film, or a lower Al (alloy) film may be combined with an upper Mo (alloy) film. The specific substances provided herein are just examples and the gate lines 121 may be made of various metals or conductors not explicitly mentioned herein.

The lateral sides of the gate lines 121 are inclined relative to a surface of the substrate 110 to form an inclination angle of about 30-80 degrees.

A gate insulating layer 140, which is preferably made of silicon nitride (SiNx) or silicon oxide (SiOx), is formed on the gate lines 121.

A plurality of semiconductor stripes 151, preferably made of hydrogenated amorphous silicon (abbreviated to "a-Si") or polysilicon, are formed on the gate insulating layer 140. The semiconductor stripes 151 extend in a second direction that is substantially perpendicular to the first direction. Each of the semiconductor stripes 151 includes a plurality of projections 154 branching out toward the gate electrodes 124.

A plurality of ohmic contact stripes and islands 161 and 165 are formed on the semiconductor stripes 151. The ohmic contact stripes and islands 161 and 165 are preferably made of n+hydrogenated a-Si heavily doped with an N-type impurity such as phosphorus, or they may be made of silicide. Each ohmic contact stripe 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110 to form inclination angles that are preferably in a range of about 30-80 degrees.

A plurality of data lines 171 and a plurality of drain electrodes 175 are formed on the ohmic contacts 161 and 165 and the gate insulating layer 140.

The data lines 171 transmit data signals and extend substantially in the second direction to intersect the gate lines 121. Each data line 171 includes a plurality of source electrodes 173 projecting toward the gate electrodes 124, and an end portion 179 having a large area for contact with another layer or an external driving circuit. A data driving circuit (not shown) for generating the data signals may be mounted on an FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124. Each of the drain electrodes 175 includes a wide end portion, an expansion 177, and a narrow end portion. The narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of a refractory metal such as Cr, Mo, Ta, Ti, or alloys thereof. However, the data lines 171 may have a multilayered structure including a refractory metal film (not shown) and a low-resistivity film (not shown). For example, the multi-layered structure may be a double-layered structure including a lower Cr/Mo (alloy) film and an upper Al (alloy) film, or a triple-layered structure of a lower Mo (alloy) film, an intermediate Al (alloy) film, and an upper Mo (alloy) film. The specific materials and structure mentioned herein for the data lines 171 and the drain electrodes 175 are not limitations of the invention and the data lines 171 and the drain electrodes 175 may be made of various metals or conductors not explicitly mentioned herein.

The data lines 171 and the drain electrodes 175 have inclined edge profiles, and the inclination angles with respect to the substrate 110 are about 30-80 degrees.

The ohmic contacts 161 and 165 are interposed only between the underlying semiconductor stripes 151 and the overlying conductors 171 and 175, to reduce the contact resistance between the semiconductor stripes 151 and the conductors 171, 175.

The semiconductor stripes 151 have almost the same planar shapes as the data lines 171 and the drain electrodes 175 as well as the underlying ohmic contacts 161 and 165. However, the semiconductor stripes 151 include some exposed portions that are not covered with the data lines 171 or the drain electrodes 175, such as the portions located between the source electrodes 173 and the drain electrodes 175.

A passivation layer 180 is formed on the gate lines 121, the data lines 171, the drain electrodes 175, and the exposed portions of the semiconductor stripes 151.

The passivation layer 180 is made of an inorganic insulator such as silicon nitride. However, the passivation layer 180 may be made of an organic insulator having a good flatness characteristic and photosensitivity, or low dielectric insulating material that has a dielectric constant lower than 4.0 such as a-Si:C:O and a-Si:O:F formed by plasma enhanced chemical vapor deposition (PECVD). The passivation layer 180 may have a double-layered structure including a lower inorganic film and an upper organic film.

The passivation layer 180 has lower sidewalls of a plurality of contact holes 182 exposing the end portions 179 of the data lines 171 and lower sidewalls of a plurality of openings 187 exposing the areas enclosed by the gate lines 121 and the data lines 171. The passivation layer 180 and the gate insulating layer 140 have lower sidewalls of a plurality of contact holes 181 exposing end portions 129 of the gate lines 121.

A photoresist film 52 is formed on the passivation layer 180. The photoresist film 52 has upper sidewalls of the contact holes 182 and the openings 187 to form the contact hole 182 and the openings 187. The openings 187 expose a portion of the drain electrode 175 and a portion of the gate insulating layer 140. The photoresist film 52 forms the upper sidewalls of the contact holes 181.

A plurality of pixel electrodes 191 are formed in the openings 187, respectively, and a plurality of contact assistants 81 and 82 are formed in the contact holes 181 and 182, respectively. The pixel electrodes 191 and the contact assistants 81, 82 are preferably made of a transparent conductor such as ITO, IZO, or a-ITO, or a reflective conductor such as Ag, Al, Cr, or alloys thereof. Sidewalls of the pixel electrodes 191 and the contact assistants 81 and 82 are formed in part by the passivation layer 180 and the photoresist film 52. Surface heights from the surface of the substrate 110 to the surfaces of the pixel electrodes 191 and the contact assistants 81 and 82 formed on the sidewalls of the passivation layer 180 and the photoresist film 52 are the same as the surface height of the photoresist film 52. The pixel electrodes 191 are physically and electrically connected to the drain electrodes 175 through the openings 187 such that the pixel electrodes 191 receive data voltages from the drain electrodes 175. The pixel electrodes 191 supplied with the data voltages generate electric fields in cooperation with a common electrode that is usually located on the opposing color filter panel. The common electrode is supplied with a common voltage. The electric field generated between the pixel electrodes and the common electrode determine the orientations of liquid crystal molecules (not shown) of a liquid crystal layer disposed between the two panels.

Concerning an LCD, a pixel electrode 191 and a common electrode form a capacitor referred to as "liquid crystal capacitor," which stores applied voltages after the TFT turns off. An additional capacitor called a "storage capacitor," which is connected in parallel to the liquid crystal capacitor, is provided for enhancing the voltage storing capacity. The storage capacitors are implemented by overlapping the pixel electrodes 191 with previous gate lines 121 adjacent thereto or separate signal lines. The capacitances of the storage capacitors (i.e., the storage capacitances) may be increased by providing projections (not shown) at the gate lines 121 to increase the overlapping areas between the pixel electrodes 191 and the gate line 121 or another signal line, and by providing storage capacitor conductors (not shown) that are connected to the pixel electrodes 191 and overlap the projections of the gate lines 121. The storage capacitor conductors may be positioned under the pixel electrodes 191 to decrease the distance between the terminals.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

The photoresist film 52 is disposed on the passivation layer 180 in the embodiment shown. However, it may be moved such that it does not remain on the passivation layer 180.

Now, a method of manufacturing the TFT array panel shown in FIGS. 1-2B according to an embodiment of the present invention will be described in detail with reference to FIGS. 3 to 13B as well as FIGS. 1 to 2B.

Figure 3:
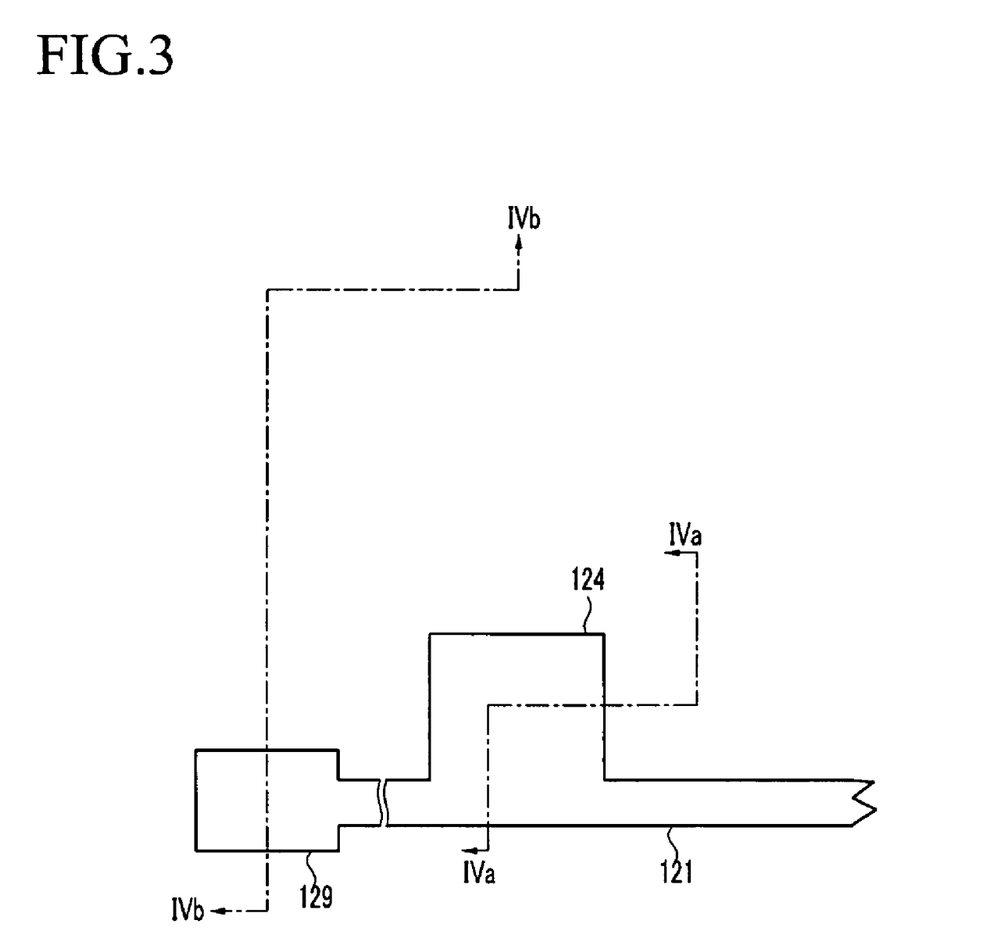
FIGS. 3, 6, and 11 are layout views of a TFT array panel shown in FIGS. 1 to 2B in intermediate steps of a manufacturing method thereof according to an embodiment of the present invention.
Figure 4A:
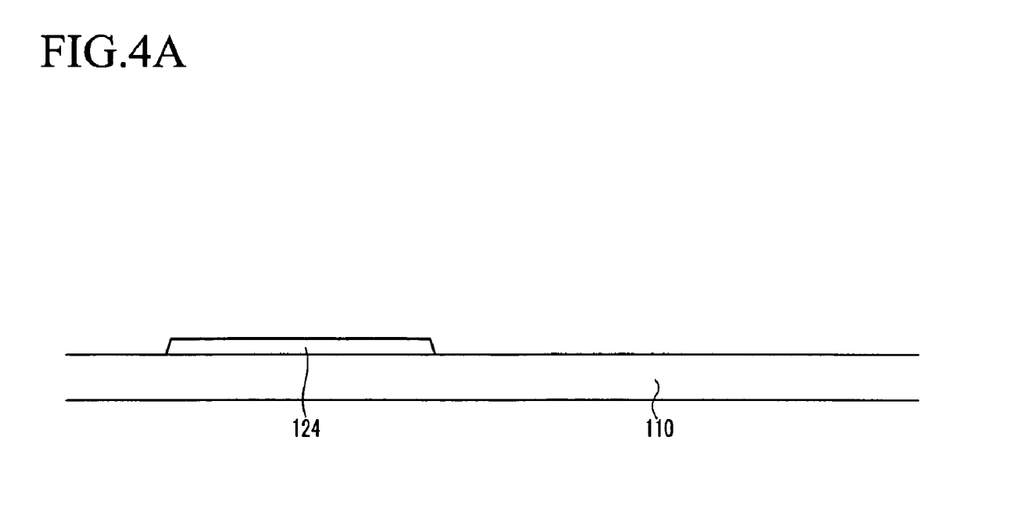
FIG. 4A is a sectional view of the TFT array panel shown in FIG. 3 taken along the line IVA-IVA.
Figure 4B:
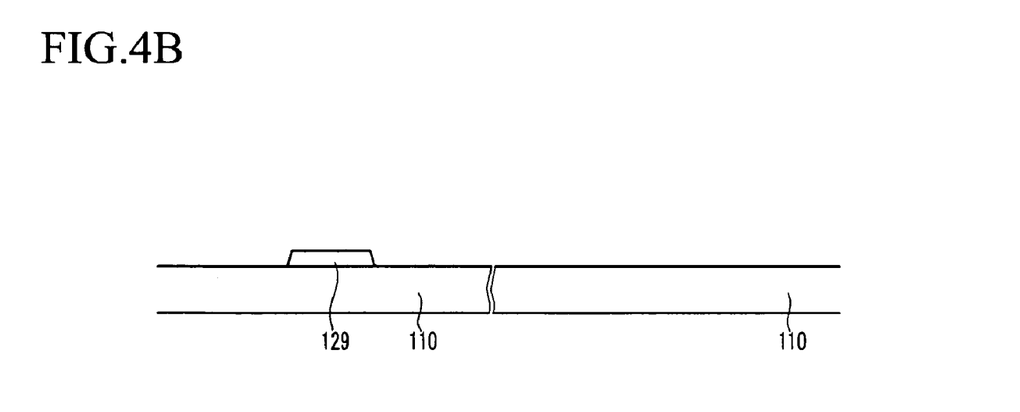
FIG. 4B is a sectional view of the TFT array panel shown in FIG. 3 taken along the line IVB-IVB.
Figure 5A:
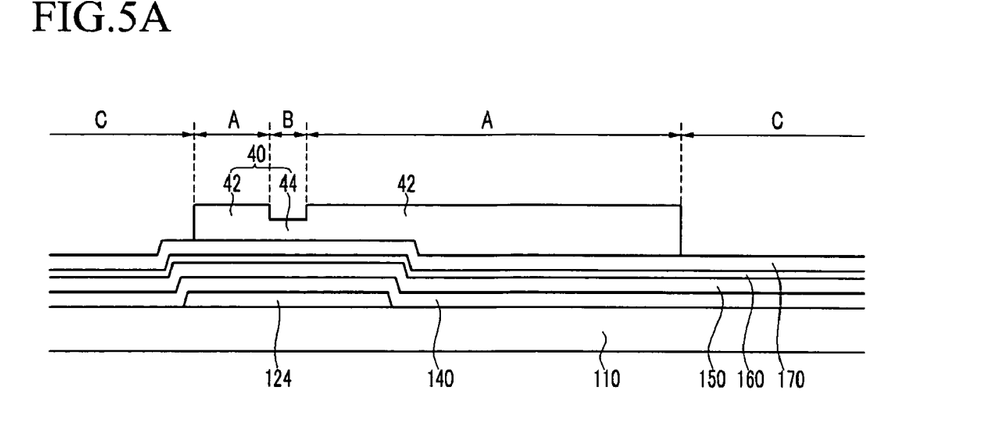
FIG. 5A is a sectional view of the TFT array panel shown in FIG. 3 taken along the line IVA-IVA after additional steps are performed to the state illustrated in FIG. 4A.
Figure 5B:
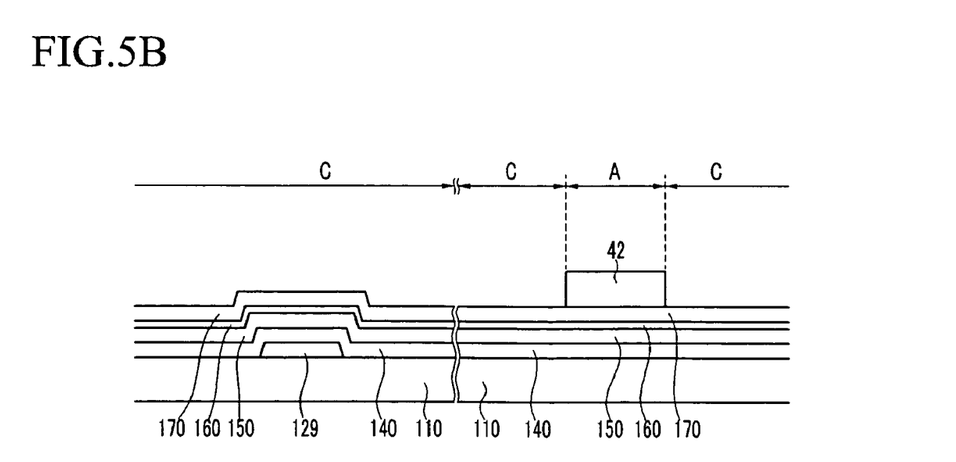
FIG. 5B is a sectional view of the TFT array panel shown in FIG. 3 taken along the line IVB-IVB after additional steps are performed to the state illustrated in FIG. 4B.
Figure 6:
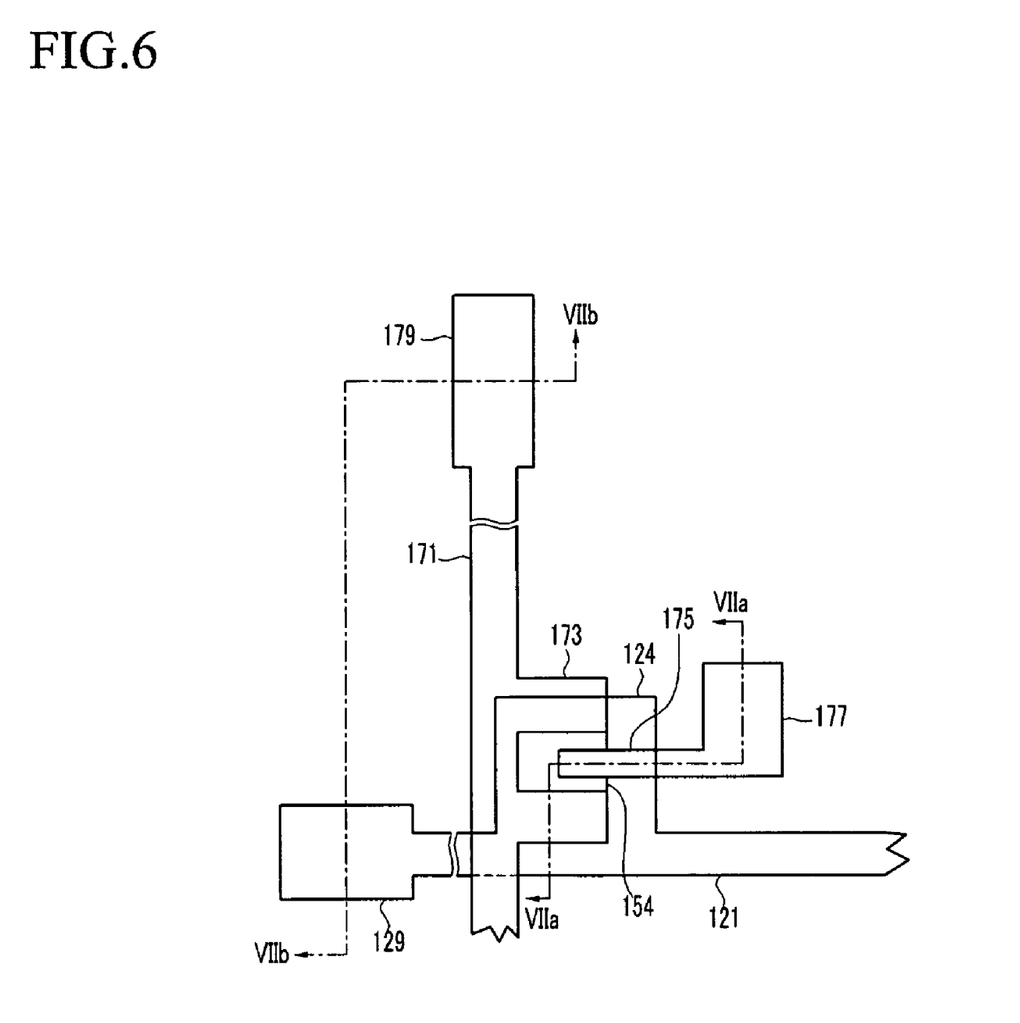
Figure 7A:
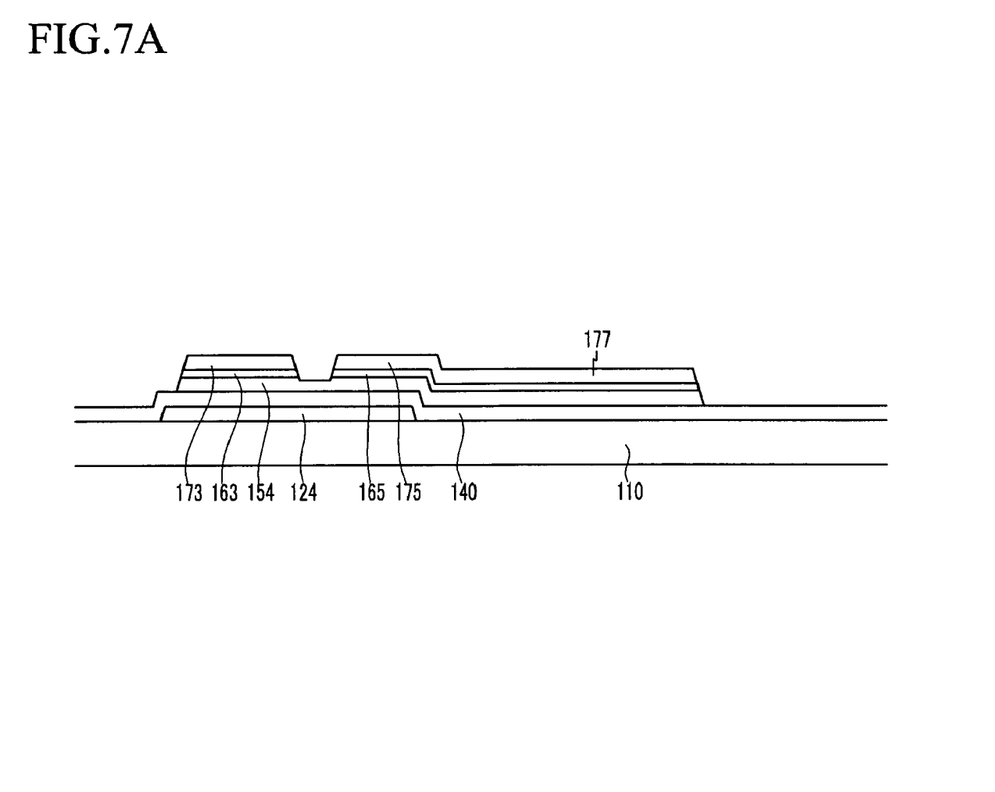
FIG. 7A is a sectional view of the TFT array panel shown in FIG. 6 taken along the line VIIA-VIIA.
Figure 7B:
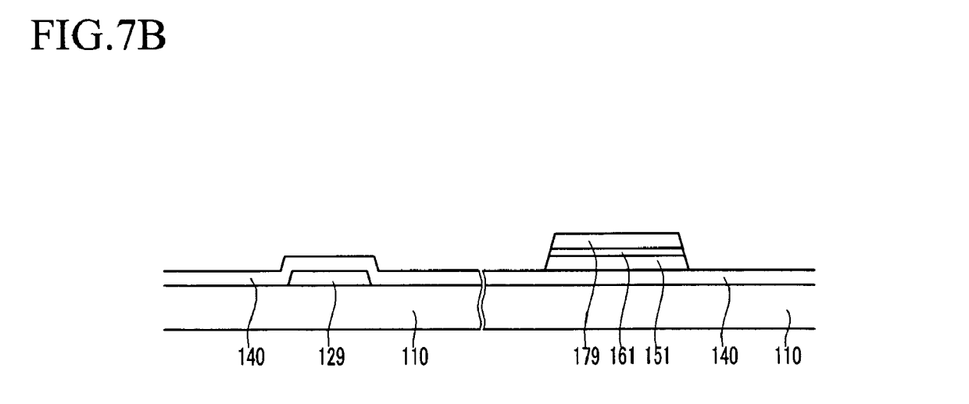
FIG. 7B is a sectional view of the TFT array panel shown in FIG. 6 taken along the lines VIIB-VIIB.
Figure 8A:
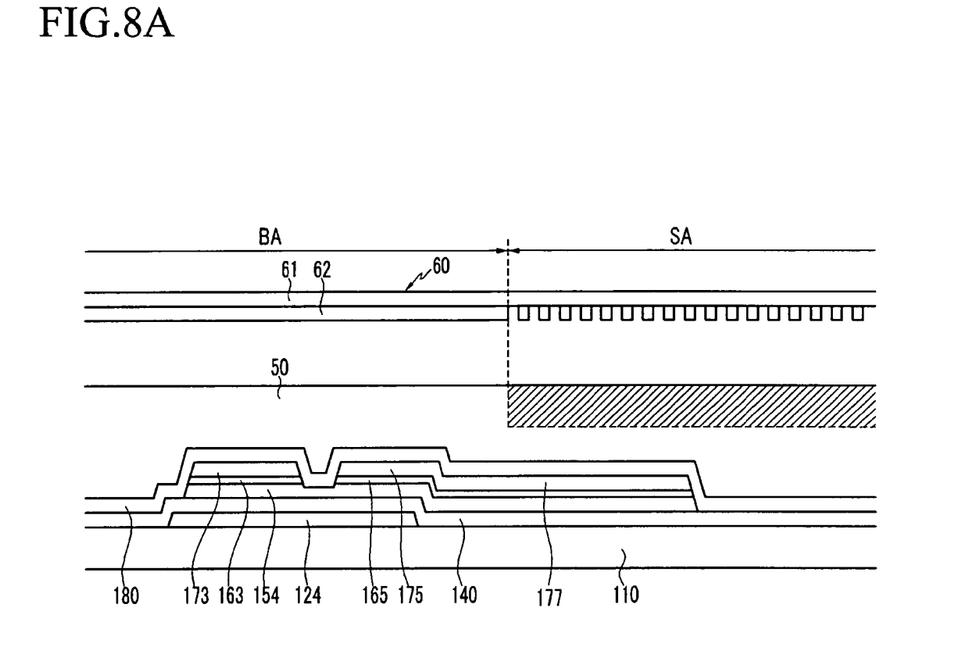
FIG. 8A is a sectional view of the TFT array panel shown in FIG. 6 taken along the line VIIA-VIIA after additional steps are performed to the state illustrated in FIG. 7A.
Figure 8B:
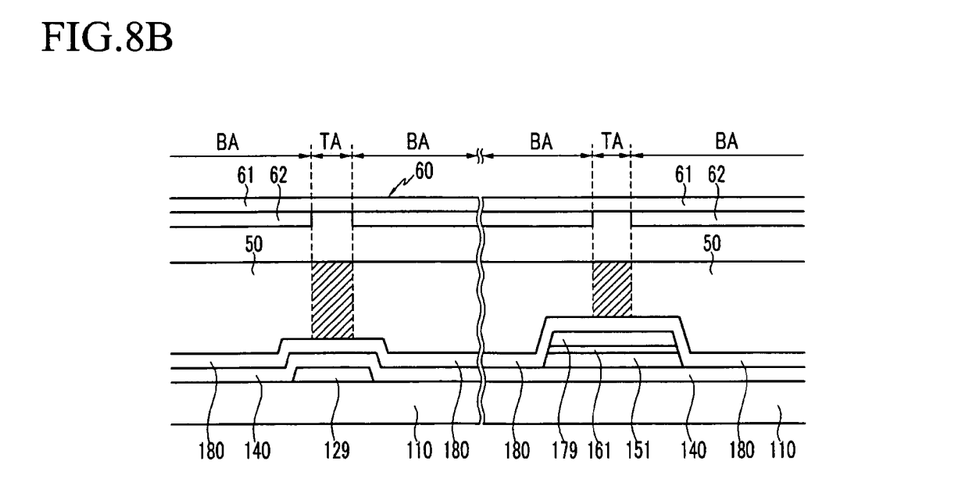
FIG. 8B is a sectional view of the TFT array panel shown in FIG. 6 taken along the lines VIIB-VIIB after additional steps are performed to the state illustrated in FIG. 7B.
Figure 9A:
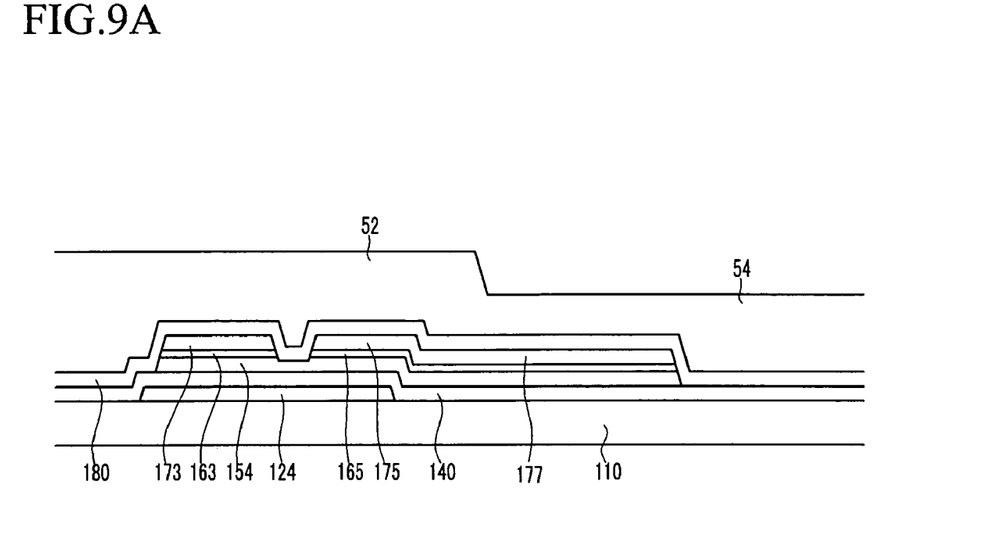
FIG. 9A is a sectional view of the TFT array panel following the step shown in FIG. 8A.
Figure 9B:
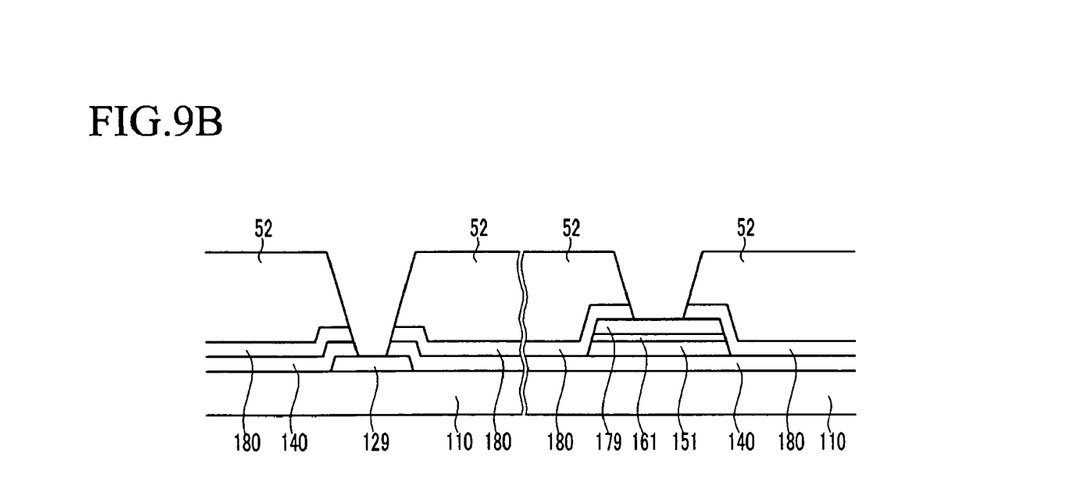
FIG. 9B is a sectional view of the TFT array panel following the step shown in FIG. 8B.
Figure 11:
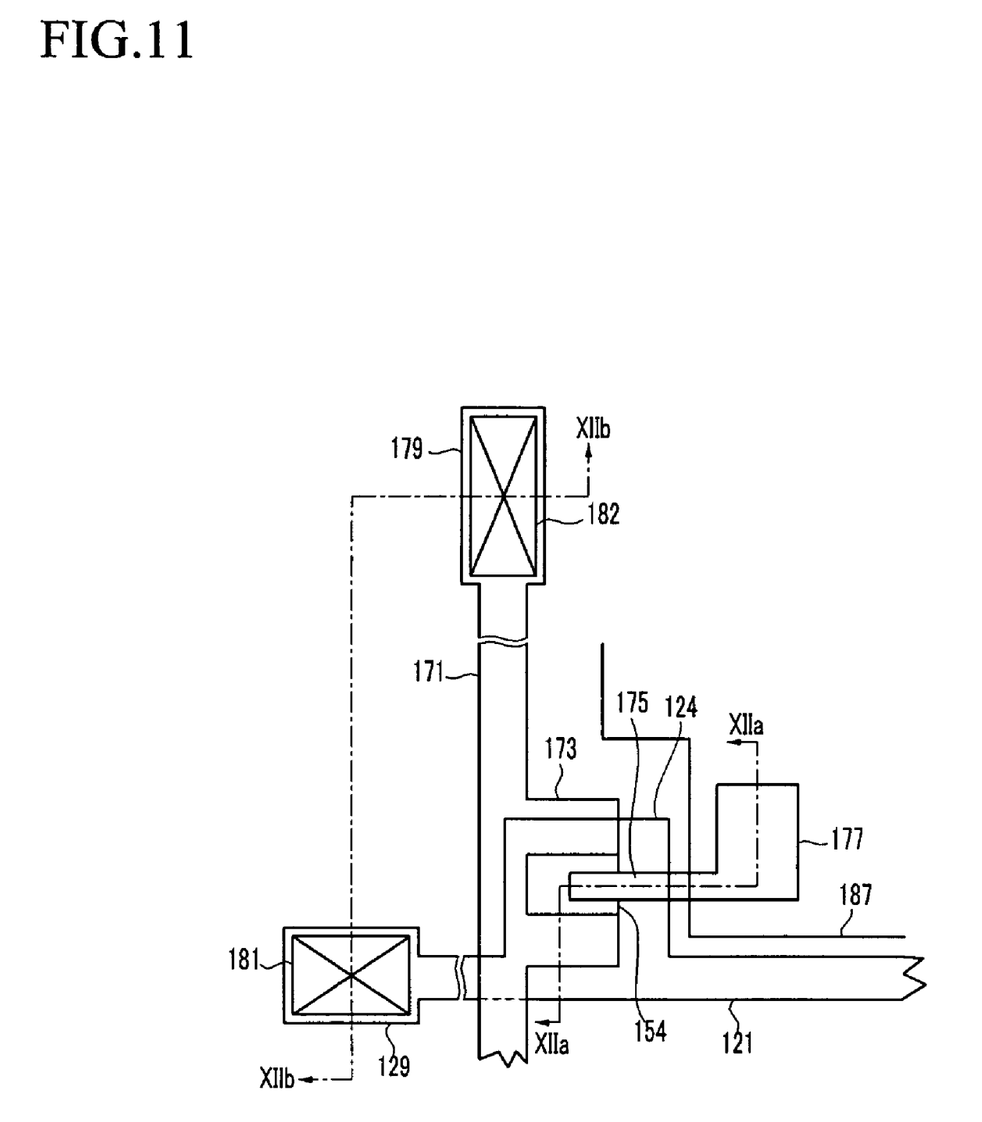
Figure 12A:
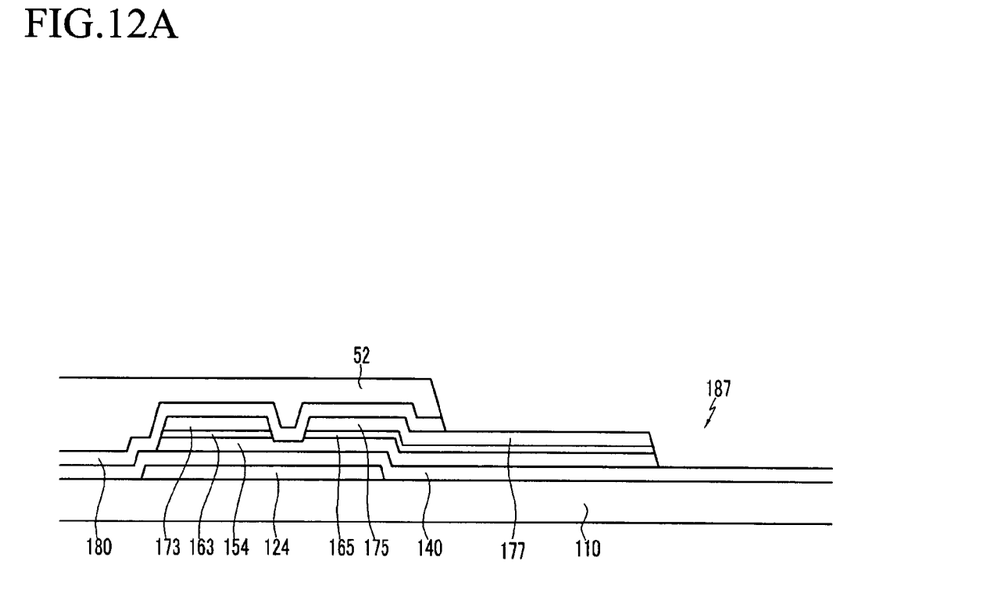
FIG. 12A is a sectional view of the TFT array panel shown in FIG. 11 taken along the line XIIA-XIIA.
Figure 12B:
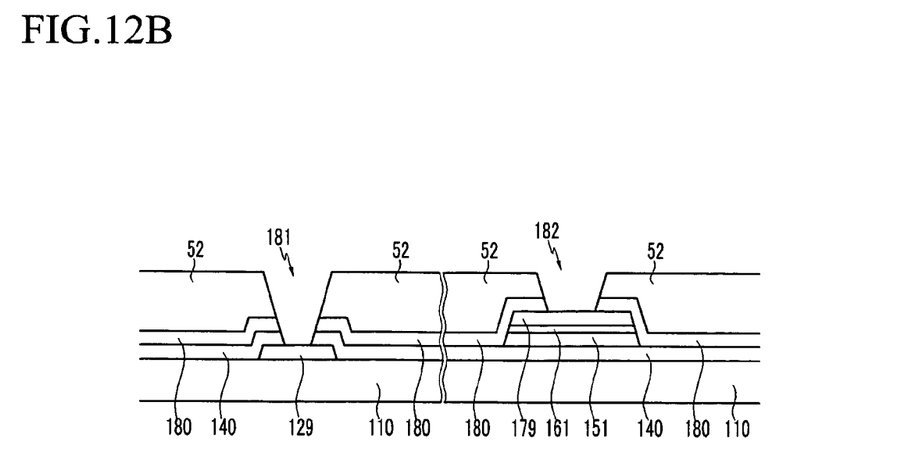
FIG. 12B is a sectional view of the TFT array panel shown in FIG. 11 taken along the lines XIIB-XIIB.
Figure 13A:
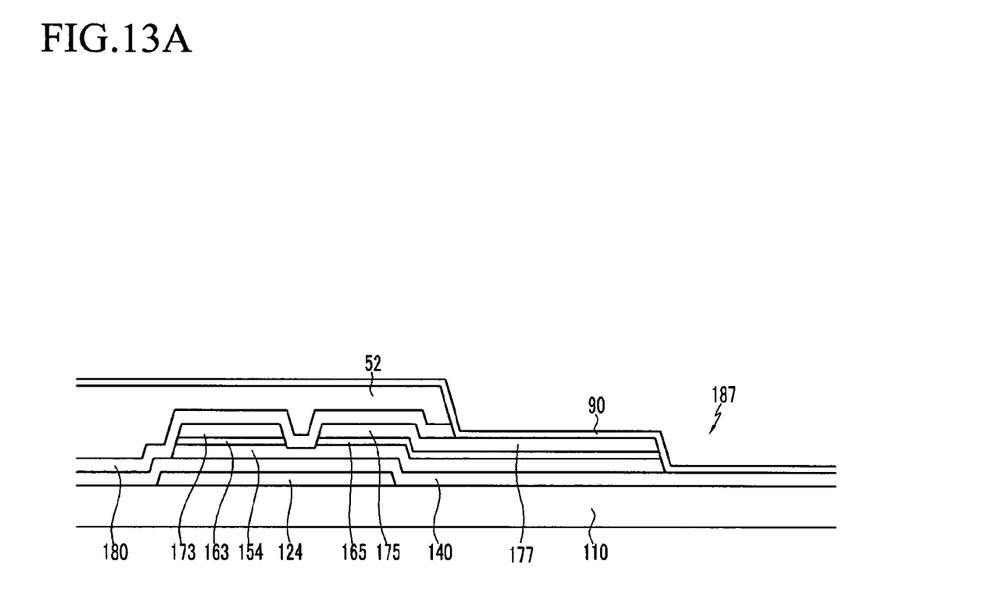
FIG. 13A is a sectional view of the TFT array panel following the step shown in FIG. 12A.
Figure 13B:
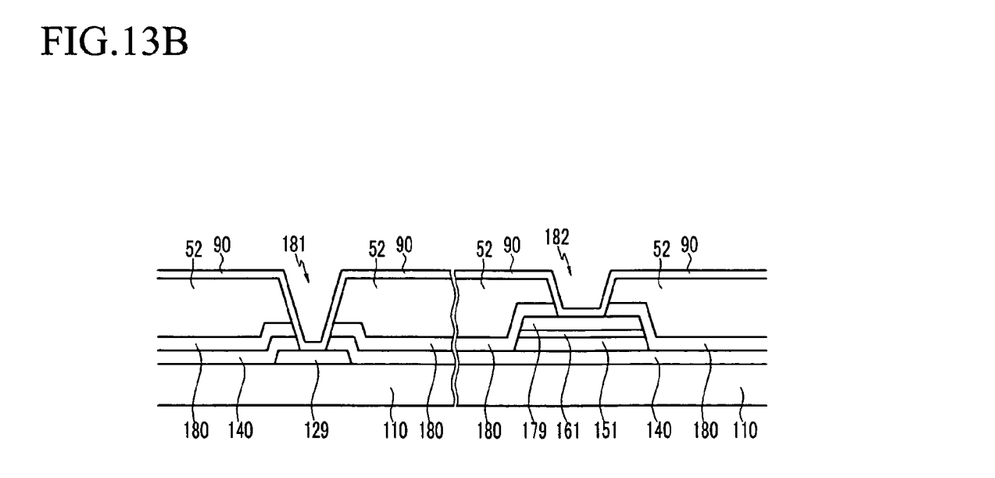
FIG. 13B is a sectional view of the TFT array panel following the step shown in FIG. 12B.

FIGS. 3, 6, and 11 are layout views of a TFT array panel shown in FIGS. 1 to 2B in intermediate steps of a manufacturing method thereof according to an embodiment of the present invention, FIG. 4A is a sectional view of the TFT array panel shown in FIG. 3 taken along the line IVA-IVA, and FIG. 4B is a sectional view of the TFT array panel shown in FIG. 3 taken along the line IVB-IVB. FIG. 5A is a sectional view of the TFT array panel shown in FIG. 3 taken along the line IVA-IVA after additional steps are performed to the state illustrated in FIG. 4A, and FIG. 5B is a sectional view of the TFT array panel shown in FIG. 3 taken along the line IVB-IVB after additional steps are performed to the state illustrated in FIG. 4B. FIG. 7A is a sectional view of the TFT array panel shown in FIG. 6 taken along the line VIIA-VIIA, and FIG. 7B is a sectional view of the TFT array panel shown in FIG. 6 taken along the lines VIIB-VIIB. FIG. 8A is a sectional view of the TFT array panel shown in FIG. 6 taken along the line VIIA-VIIA after additional steps are performed to the state illustrated in FIG. 7A, and FIG. 8B is a sectional view of the TFT array panel shown in FIG. 6 taken along the lines VIIB-VIIB after additional steps are performed to the state illustrated in FIG. 7B. FIG. 9A is a sectional view of the TFT array panel following the step shown in FIG. 8A, FIG. 9B is a sectional view of the TFT array panel following the step shown in FIG. 8B. FIG. 12A is a sectional view of the TFT array panel shown in FIG. 11 taken along the line XIIA-XIIA, and FIG. 12B is a sectional view of the TFT array panel shown in FIG. 11 taken along the lines XIIB-XIIB. FIG. 13A is a sectional view of the TFT array panel following the step shown in FIG. 12A, and FIG. 13B is a sectional view of the TFT array panel following the step shown in FIG. 12B.

Referring to FIGS. 3 to 4B, a conductive layer preferably made of metal is deposited on an insulating substrate 110 preferably made of transparent glass by sputtering, etc. The conductive layer is then subjected to lithography and etching to form a plurality of gate lines 121 including gate electrodes 124 and end portions 129.

Referring to FIGS. 5A and 5B, a gate insulating layer 140, an intrinsic a-Si layer 150, and an extrinsic a-Si layer 160 are sequentially deposited by CVD. The gate insulating layer 140 is preferably made of silicon nitride and has a thickness of about 2,000-5,000 Å. The deposition temperature of the gate insulating layer 140 is preferably in a range of about 250-400° C.

A conductive layer 170 preferably made of metal is then deposited by sputtering, etc, and a photoresist film 40 with a thickness of about 1-2 microns is coated on the conductive layer 170.

The photoresist film 40 is exposed to light through a photo mask (not shown), and developed such that the developed photoresist has a position dependent thickness. The photoresist shown in FIGS. 5A and 5B includes a plurality of first to third portions in order of decreasing thickness. The first portions located on wire areas A and the second portions located on channel areas B are indicated by reference numerals 42 and 44, respectively, and no reference numeral is assigned to the third portions at remaining areas C since they have substantially zero thickness. The underlying portions of the conductive layer 170 are exposed in area C. The thickness ratio of the second portions 44 to the first portions 42 is adjusted depending upon the process conditions in the subsequent process steps. It is preferable that the thickness of the second portions 44 is equal to or less than half of the thickness of the first portions 42, and in particular, equal to or less than 4,000 Å.

The position-dependent thickness of the photoresist is obtained by several techniques, for example, by providing translucent areas on the exposure mask as well as light transmitting areas and light blocking opaque areas. The translucent areas may have a slit pattern or a lattice pattern. Alternatively, the translucent areas may be thin film(s) with intermediate transmittance or intermediate thickness. When using a slit pattern, it is preferable that the width of the slits or the distance between the slits is smaller than the resolution of a light exposer used for photolithography. Another example is to use reflowable photoresist. In detail, once a photoresist pattern made of a reflowable material is formed by using a normal exposure mask only with transparent areas and opaque areas, to the material flows onto areas without the photoresist, thereby forming thin portions.

The different thicknesses of the photoresist 42 and 44 enable selective etching of the underlying layers when using suitable process conditions. Therefore, a plurality of data lines 171 including source electrodes 173 and end portions 179, a plurality of drain electrodes 175 and wide end portions 177, a plurality of ohmic contact stripes 161 including projections 163, a plurality of ohmic contact islands 165, and a plurality of semiconductor stripes 151 including projections 154 are obtained as shown in FIGS. 6, 7A, and 7B by a series of etching steps.

For descriptive purpose, portions of the conductive layer 170, the extrinsic a-Si layer 160, and the intrinsic a-Si layer 150 on the wire areas A are referred to as first portions. Portions of the conductive layer 170, the extrinsic a-Si layer 160, and the intrinsic a-Si layer 150 on the channel areas B are referred to as second portions. Portions of the conductive layer 170, the extrinsic a-Si layer 160, and the intrinsic a-Si layer 150 on the remaining areas C are referred to as third portions.

An exemplary sequence of forming such a structure is as follows:

(1) Removal of third portions of the conductive layer 170, the extrinsic a-Si layer 160, and the intrinsic a-Si layer 150 on the wire areas A;

(2) Removal of the second portions 44 of the photoresist;

(3) Removal of the second portions of the conductive layer 170 and the extrinsic a-Si layer 160 on the channel areas B; and (4) Removal of the first portions 42 of the photoresist.

Another exemplary sequence is as follows:

(1) Removal of the third portions of the conductive layer 170;

(2) Removal of the second portions 44 of the photoresist;

(3) Removal of the third portions of the extrinsic a-Si layer 160 and the intrinsic a-Si layer 150;

(4) Removal of the second portions of the conductive layer 170;

(5) Removal of the first portions 42 of the photoresist; and (6) Removal of the second portions of the extrinsic a-Si layer 160.

When the second portions 44 are removed, a thickness of the first portions 42 of the photoresist may be decreased.

However, since the thickness of the second portions 44 is thinner than that of the first portions 42, the first portions 42 are not removed, and thereby layers underlying the first portions 42 are protected.

Residue of the photoresist remained on the surface of the conductive layer 170 may be removed by ashing, etc.

Referring to FIGS. 8A and 8B, a passivation layer 180 is deposited and a positive photoresist film 50 is coated. Thereafter, a photo mask 60 is aligned with the substrate 110. The thickness of the photoresist film 50 is preferably thicker than about 1 micron, and further preferably about 1 to 4 microns.

The photo mask 60 includes a transparent substrate 61 and an opaque light blocking film 62, and it is divided into light transmitting areas TA, light blocking areas BA, and translucent areas SA. The light blocking film 62 is not disposed on the light transmitting areas TA, but it is disposed on the light blocking areas BA and the translucent areas SA. The light blocking film 62 exists as a wide area having a width larger than a predetermined value on the light blocking areas BA, and it exists as a plurality of areas having width or distance smaller than a predetermined value to form slits. The translucent areas SA are formed on the areas enclosed by the gate lines 121 and the data lines 171 including a portion of the expansion 177 of the drain electrode 175, the light transmitting areas TA are formed on the end portions 129 of the gate lines 121 and the end portions 179 of the data lines 171, and the light blocking areas BA are formed on the remaining portions.

The photoresist film 50 is exposed to light through the photo mask 60 and is developed such that portions of the photoresist film 50 that receive a predetermined amount of light are removed. Referring to FIGS. 8A and 8B, portions of the photoresist film 50 facing the light transmitting areas TA are removed, portions of the photoresist film 50 facing the translucent areas SA come to have a reduced thickness, and portions of the photoresist film 50 facing the light blocking areas BA remain. Thereby, as shown in FIGS. 9A and 9B, a first portion 52 of the photoresist film 50 and a second portion 54 thinner than the first portion 52 remain. In FIGS. 8A and 8B, the hatched portions indicate the portions of the photoresist film 50 that are removed after development.

Figure 10A:
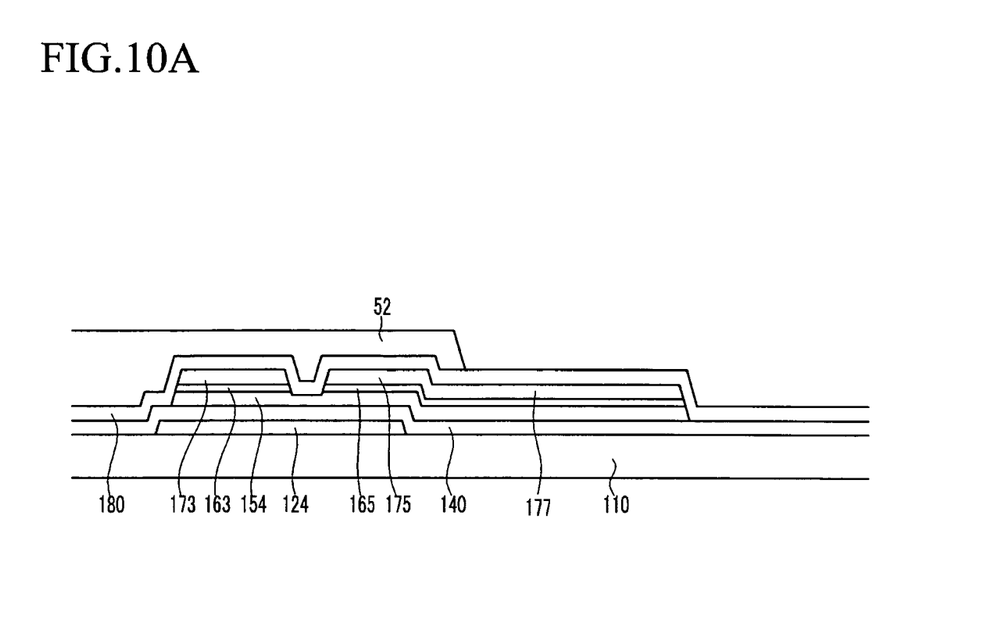
FIG. 10A is a sectional view of the TFT array panel following the step shown in FIG. 9A.
Figure 10B:
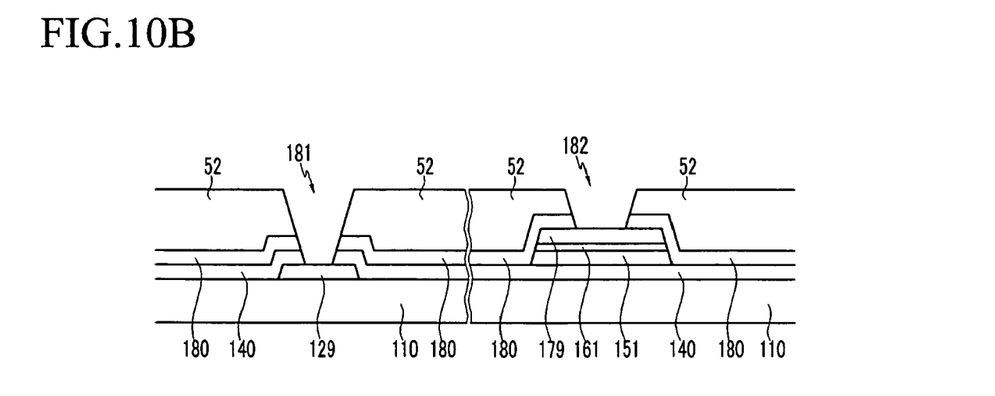
FIG. 10B is a sectional view of the TFT array panel following the step shown in FIG. 9B.

Referring to FIGS. 10A and 10B, the passivation layer 180 and the gate insulating layer 140 are etched using the remaining portions 52 and 54 of the photoresist film 50 as an etch mask to form a plurality of contact holes 181 and 182 exposing the end portions 129 of the gate lines 121 and the end portions 179 of the data lines 171, respectively. Thereafter, the thin portions 54 of the photoresist film 50 are removed by ashing, etc., and the thickness of the thick portions 52 is decreased. The etching of the gate insulating layer 140 and the passivation layer 180 uses $O_2$, and therefore, sidewalls of the gate insulating layer 140 and the passivation layer 180 may have a positive taper shape.

Referring to FIGS. 11 to 12B, the exposed passivation layer 180 is removed using the remaining portion 52 of the photoresist film 50 as an etch mask to form a plurality of openings 187 exposing the areas enclosed by the gate lines 121 and the data lines 171.

Referring to FIGS. 13A and 13B, a conductive film 90 preferably made of IZO, ITO, or amorphous ITO is deposited on the remaining portion 52 of the photoresist film 50, a portion of the exposed drain electrode 175, and a portion of the gate insulating layer 140 by sputtering, etc. When the conductive film 90 is made of IZO, IDIXO (indium x-metal oxide manufactured by Idemitsu Co. of Japan) may be used as a target material. The IZO may preferably include $In_2O_2$ and ZnO, and the amount of Zn in the total amount of indium and Zn may preferably be about 15 to 20 atomic %. The temperature of the sputtering is preferably about 250° C. or less, to minimize contact resistance to other conductive layers.

Since the sidewalls of the gate insulating layer 140 and the passivation layer 180 have the positive taper shape, the conductive film 90 does not become unfastened at the boundary of the passivation layer 180 or the gate insulating layer 140.

A CMP (chemical mechanical polishing) process is performed to polish the conductive film 90 on the remaining portion 52, and thereby the conductive film 90 only remains on the area enclosed by the gate lines 121 and the data lines 171, the end portions 129 of the gate lines 121, and the end portions 179 of the data lines 171. However, the passivation layer 180 under the remaining portion 52 of the photoresist film 50 preferably remains.

When the thickness of the photoresist film 50 formed on the passivation 180 is as thick as about 1 to 4 microns, a margin of the CMP increases, and thereby the flatness of the photoresist film 50 after the polishing increases.

The remaining conductive film 90 on the area enclosed by the gate lines 121 and the data lines 171 forms a plurality of pixel electrodes 191, and the remaining conductive film 90 on the end portions 129 and 179 of the gate lines 121 and the data lines 171 forms a plurality of contact assistants 81 and 82, respectively, as shown in FIGS. 1 to 2B.

Surface heights of the pixel electrodes 191 and the contact assistants 81 and 82 formed on the sidewalls of the passivation layer 180, and the remaining portion 52 of the photoresist film 50 is the same as a surface height of the remaining portion 52 of the photoresist film 50.

In some embodiments, the remaining portion 52 of the photoresist film 50 formed on the passivation layer 180 may be removed. At this time, since the remaining portion 52 of the photoresist film 50 is exposed, the removal of the remaining portion 52 is easy.

In the above embodiment, a portion of the gate insulating layer 140 remains on the areas enclosed by the gate lines 121 and the data lines 171 by using a slit mask, but the portion of the gate insulating layer 140 may be removed without the slit mask.

Since a portion of the conductive film 90 is removed by the CMP process to form the pixel electrodes 191 and the contact assistants 81 and 82, a lift-off process in which the conductive film 90 disposed on the photoresist film 52 comes off along with the photoresist film 52 is unnecessary.

The data lines 171, the drain electrodes 175, the ohmic contacts 163 and 165, and the semiconductors 151 are formed using one lithography step, and the pixel electrodes 191 and the contact assistants 81 and 82 are formed in the same step, to simplify the manufacturing method.

As described above, the pixel electrodes and the contact holes connecting the drain electrodes and the pixel electrodes are formed using a single lithography step. Accordingly, extra lithography steps for forming the pixel electrodes separately is omitted to simplify the manufacturing method, thereby reducing the manufacturing time and the cost.

Also, the pixel electrodes and the contact assistants are formed using the CMP process without the lift-off, further reducing the manufacturing time and cost.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel, the method comprising:
    forming a thin film transistor having a gate electrode, a source electrode, and a drain electrode on a substrate;
    forming a passivation layer on the source electrode and the drain electrode;
    forming a photoresist film on the passivation layer;
    selectively etching the passivation layer using the photoresist film as a mask;
    forming a conductive film on the remaining portion of the photoresist film and a portion of the gate and the drain electrode; and
    removing the photoresist film and the conductive film using a chemical mechanical polishing process to form a pixel electrode connected to the drain electrode.

2. The method of claim 1, wherein the photoresist film is formed by using a photo mask including a light blocking area, a translucent area, and a light transmitting area and the photoresist film has a position-dependent thickness.

3. The method of claim 2, wherein the etching of a passivation layer comprises forming a remaining portion of the photoresist film corresponding to the light blocking area of the photo mask.

4. The method of claim 3, wherein the sidewalls of the passivation layer and the remaining portion of the photoresist film have a positive taper shape.

5. The method of claim 4, wherein a surface height of the pixel electrode formed on the remaining portion of the photoresist film is the same as a surface height of the remaining portion of the photoresist film.

6. The method of claim 2, wherein the translucent area is formed on an area enclosed by the gate line and the data line, including a portion of the drain electrode.

7. The method of claim 6, wherein the etching of a passivation layer comprises forming a first contact hole exposing an end portion of the data line.

8. The method of claim 7, wherein the etching of a passivation layer further comprises forming a second contact hole exposing an end portion of the gate line by etching the passivation layer with the gate insulating layer.

9. The method of claim 8, wherein the formation of a pixel electrode comprises forming first and second contact assistants connected to the end portion of the data line and the end portion of the gate line through the first and second contact holes, respectively.

10. A method of manufacturing a thin film transistor array panel, the method comprising:
    forming a gate line including a gate electrode on a substrate;
    forming a gate insulating layer on the gate line;
    forming a semiconductor layer on the gate insulating layer;
    forming an ohmic contact layer on the semiconductor layer;
    forming a data line and a drain electrode on the ohmic contact layer;
    forming a passivation layer on the data line and the drain electrode;
    forming a first photoresist film on the passivation layer;
    etching the passivation layer using the first photoresist film as a mask;
    forming a conductive film on the remaining portion of the first photoresist film, a portion of the gate and the drain electrode and a portion of the gate insulating layer; and
    removing the first photoresist film and the conductive film using a chemical mechanical polishing process to form a pixel electrode connected to the drain electrode.

11. The method of claim 10, wherein the first photoresist film is formed by using a photo mask including a light blocking area, a translucent area, and a light transmitting area so that the first photoresist film has a position-dependent thickness.

12. The method of claim 11, wherein the translucent area is formed on an area enclosed by the gate line and the data line, including a portion of the drain electrode.

13. The method of claim 11, wherein the etching of a passivation layer comprises forming a remaining portion of the first photoresist film corresponding to the light blocking area of the photo mask.

14. The method of claim 13, wherein the sidewalls of the passivation layer, the gate insulating layer and the remaining portion of the photoresist film have a positive taper shape.

15. The method of claim 9, wherein a surface height of the pixel electrode formed on the remaining portion of the first photoresist film is the same as a surface height of the remaining portion of the first photoresist film.

16. The method of claim 10, wherein the etching of a passivation layer comprises forming a first contact hole exposing an end portion of the data line.

17. The method of claim 16, wherein the etching of a passivation layer further comprises forming a second contact hole exposing an end portion of the gate line by etching the passivation layer with the gate insulating layer.

18. The method of claim 17, wherein the formation of a pixel electrode comprises forming first and second contact assistants connected to the end portion of the data line and the end portion of the gate line through the first and second contact holes, respectively.

19. The method of claim 10, wherein the formation of the semiconductor layer and the formation of the data line and the drain electrode comprise:
    depositing the gate insulating layer, an intrinsic a-Si layer, an extrinsic a-Si layer, and a conductive layer in sequence;
    forming a second photoresist film on the conductive layer, such that the second photoresist film has different thicknesses in accordance with positions of the conductive layer; and
    selectively etching the conductive layer, the extrinsic a-Si layer, and the intrinsic a-Si layer using the second photoresist film as a mask to form the data line, the drain electrode, and the ohmic contact layer.

20. The method of claim 19, wherein the second photoresist film is formed by using a photo mask including a light blocking area, a translucent area, and a light transmitting area.

* * * * *